United States Patent [19]
Hammond et al.

[11] Patent Number: 5,635,848
[45] Date of Patent: Jun. 3, 1997

[54] METHOD AND SYSTEM FOR CONTROLLING HIGH-SPEED PROBE ACTUATORS

[75] Inventors: James M. Hammond, Boca Raton; James C. Mahlbacher, Lake Worth; Kenneth G. Roessler; Michael Servedio, both of Boca Raton, all of Fla.; Li-Cheng R. Zai, Ossining, N.Y.

[73] Assignee: International Business Machines Corporation, Armonk, N.Y.

[21] Appl. No.: 402,417

[22] Filed: Mar. 10, 1995

[51] Int. Cl.⁶ .................................................. G01R 1/073
[52] U.S. Cl. .................................................. 324/758
[58] Field of Search .................................. 324/754, 758, 324/757, 762

[56] References Cited

U.S. PATENT DOCUMENTS

| | | |
|---|---|---|
| 3,446,065 | 5/1969 | Wiesler et al. ............... 73/105 |
| 3,644,829 | 2/1972 | Chan et al. . |
| 4,195,259 | 3/1980 | Reid et al. ..................... 324/758 |
| 4,544,889 | 10/1985 | Hendriks et al. . |
| 4,870,352 | 9/1989 | Koechner ...................... 324/767 |
| 4,899,102 | 2/1990 | Hendrick et al. . |
| 4,908,571 | 3/1990 | Stoehr . |
| 5,012,186 | 4/1991 | Gleason . |
| 5,030,907 | 7/1991 | Yih et al. . |
| 5,065,106 | 11/1991 | Hendrick et al. . |
| 5,113,133 | 5/1992 | Conti et al. . |
| 5,134,365 | 7/1992 | Okubo et al. . |
| 5,150,040 | 9/1992 | Byrnes et al. . |
| 5,153,472 | 10/1992 | Karidis et al. . |
| 5,489,855 | 2/1996 | Poisel ........................... 324/762 |

OTHER PUBLICATIONS

H.P. Byrnes et al., "Dual–Mode Z–Stage Mechanism", IBM Technical Disclosure Bulletin, vol. 28, No. 7, Dec. 1985, pp. 3115–3119.

*Primary Examiner*—Ernest F. Karlsen
*Attorney, Agent, or Firm*—Richard A. Tomlin; Andrew J. Dillon

[57] ABSTRACT

A digital and analog controller for controlling a high-speed probe actuator is disclosed. This method and system provide the probe actuator system with improved damping ratio and reduced impact force, so the throughput of the tester is increased with fast settling actuator armature. With this method and system, the steady-state probe force is less sensitive to the servo system, test probe and variation in the probing distance d. An electronic circuit, which consists of analog operational amplifiers, monostable multivibrators, and D flip-flops, is presented for low-cost applications.

6 Claims, 12 Drawing Sheets

METHOD AND SYSTEM FOR CONTROLLING HIGH-SPEED PROBE ACTUATORS

BACKGROUND OF THE INVENTION

1. Technical Field

The present invention relates in general to circuit board testing and two-mode actuator control and, in particular, to a method and apparatus to enhance the probing speed of a moving actuator used in the testing of circuit boards.

2. Description of the Related Art

With constant advances in packaging technology, the number of layers and complexity of a printed circuit board of a ceramic substrate increase; therefore, the defect rate of the substrate or circuit boards also grows accordingly. Typically, up to 50 percent of all the faults of a circuit board can be found in the bare-board level. Traditionally, the tester uses the bed-of-nails approach, but this type of tester no longer meets the precision and flexibility requirements for testing, while the density of the circuitry on the boards or substrates increases dramatically.

One solution is to use a tester with movable probes because it is flexible and relatively inexpensive. Typically, this type of tester consists of positioning devices to provide planar motion and an actuator to move the test probe in the vertical direction. In high-speed testing applications, the impact force, steady-state probe force, and rebound of the test probe are considered when improving the quality of the tests. The impact force affects the depth of the footprint caused by the test probe, while the steady-state probe force is required for good electrical contact between the probe and the device surface. Appropriate control of the impact force is necessary for it might cause damage on the device under test (DUT). The steady-state probe force influences the consistency of electrical tests and should be well regulated. The rebound of the test probe determines the tester throughput since the electrical test cannot be performed until the test probe settles.

A typical commercial probing tester, such as Kollmorgan tester system,now offered by Integri-Test, or Teledyne Tac tester, consists of an actuator and a buckling spring probe. The actuator moves between two fixed positions with open-loop control. The impact force, probe contact force, and probe rebound can only be regulated by mechanical linkages and the spring probe. There are two drawbacks of this approach. One, the tester is not flexible since any change, such as the probe contact force, requires redesign of the mechanical components. Two, a small impact force demands a very light probe mass, which is difficult to design. An alternative is to control the probe actuator with an active servo system, which provides programmable probe contact force and regulates the impact force and probe settling.

There are two types of control systems for these probe actuator motions: open-loop and closed-loop. In an open-loop system, the actual position of the probe is ignored and only the applied force is defined. In a closed-loop system, the position of the probe is used to correct the control signal sent to the probe for positioning.

In an open-loop system, because only the force is used, neither the speed at which the probe is actuated nor the motion characteristics of the actuator can be controlled. When high-speed actuation is performed, often the probe will bounce on the surface, both damaging the surface and requiring a worst-case allowance for settling time because the actual position of the probe is not known.

While a closed-loop system allows for an exact positioning of the probe, there can be a problem when the probe encounters a target and the control algorithm tries to position the probe. If the probe is positioned to just contact the site, the force applied to the surface is insufficient to allow for the good electrical contact needed for electrical testing. If the closed-loop system tries to position the probe below the surface in order to have sufficient force to make good electrical contact, the system will tend to build up force and potentially damage the site. Additionally, there will be a tendency of the system to oscillate on the site as it continues to make positional corrections and a high-frequency scraping of the surface will occur.

Systems using probes to test (such as point-to-point electrical tests) require that the probe be retracted from contact with one test site before being relocated to the next test site in order to prevent damage to the device under test. After the positioning of the probe over the test site, it is the motion up and down of the probe which accounts for a significant amount of the time expended in these probing systems. Additionally, it is the motion of bringing the probe into contact with the surface which causes all of the damage to the test site.

In order to increase the speed of the probing system, a method was developed which constrains the environment in a way which maximizes the actuation speed. Specifically, an exact height of the test site and the exact position of the probe was determined. During the probing activity, the probe must be moved away from the device being tested such that relocating the probe will not result in collisions with topographical features of the device. When the constraints are applied, the probe is retracted only to the point necessary to insure that the product is not damaged during relocation of the probe. The probe is then driven back into contact with the device when the XY location of the next test site has been achieved.

When driving the probe into the device, two types of damage occur. The first type of damage is impact damage, or that due to the mass of the probe being stopped by what is being tested. This type of damage is increased as the speed of the probe is increased. The second source of damage results from the force applied to the probe as it is driven by the actuator to maintain contact with the test point (as described in the closed-loop description).

The first problem, impact damage, was initially addressed by using a spring-loaded probe to absorb the shock of the impact of the probe to the surface. This approach provided some improvement, but not enough to provide the increases in speed which were desired. One major liability of this approach was the inability of the system to control the amount of force required by the different types of electrical measurements which were being performed by the system.

SUMMARY OF THE INVENTION

It is therefore one object of the present invention to provide circuit board testing two-mode actuator control.

It is another object of the present invention to provide a method and apparatus to enhance the probing speed of a moving actuator used in the testing of circuit boards.

The foregoing objects are achieved as is now described. According to the present invention, a digital and analog controller used in a high speed probe actuator is disclosed. The controller provides a probe actuator system having improved dampening ratio and reduced impact force, which allows the through-put of the tester to be increased via a fast settling actuator armature. The invention is able to achieve a steady state probe force that is less sensitive to the servo system, test probe and variations in the probing distance. The invention also overcomes the need for a force transducer and uses analog operational amplifiers, mono-stable multi-vibrators, and D flip-flops, to provide low-cost construction.

The two-mode controller for the high speed probe actuator uses a means for positioning the test probe connected to the probe actuator to a first distance. This first distance is short of actual contact on the device under test. Then, the probe controller uses means for controlling the force of the probe actuator and placing the test probe on the device under test after the positioning means completes its placement of the test probe at the first position. The positioning means further comprises a position sensor that couples to the probe actuator and is used to detect the position of the test probe in relation to the first position. The positioning means also uses a position compensator coupled to the position sensor to control the positioning of the test probe in relation to the position sensed by the position sensor. Means for determining an estimate velocity of the probe actuator is also included and also is used to determine the velocity of the probe actuator when deciding whether to switch to the force means for positioning the probe actuator. The probe actuator is also capable of generating a viscous dampening signal to the positioning means and the force control means for dampening oscillations in the probe actuator during positioning. The viscous dampening signal may be either analog or digital.

In positioning the test probe on the device under test, the system uses the following method steps. First, the test probe is set in a first mode of positioning and then the system senses a displacement feedback of the test probe during this positioning. Next, the system determines an estimated velocity and positioner of the test probe during positioning and then determines whether the first mode of positioning should be changed to the force control mode of positioning, which is then used to position the test probe on the device under test. The final position of the test probe is determined by interpolatedly adjusting the probe until a stable position is determined. The force control mode uses a reference current to evaluate the force of the test probe based on the reference current while positioning the probe. Position feedback is used to determine the stability of the probe on the device under test.

An alternative method for positioning the test probe is also provided. This method is used to minimize damage to the surface device under test when the height of the surface is unknown. The system first positions the test probe to a first or initial position. Then the system evaluates whether this first position is within a first position range set by the user. If the range is acceptable then the system determines if an electrical current level used in positioning the test probe by the motor is within a first current range determined by the user. If both the position and current are acceptable, then the first position is checked again and the current is checked again until either range is exceeded. Once one of the ranges is exceeded, the system switches the position of the test probe from a servo control mode to an open loop control mode. Then the open loop control mode is used to position the test probe while determining whether the test position has become constant. Once the position is constant, the position is recorded and then the systems begins performing measurements.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
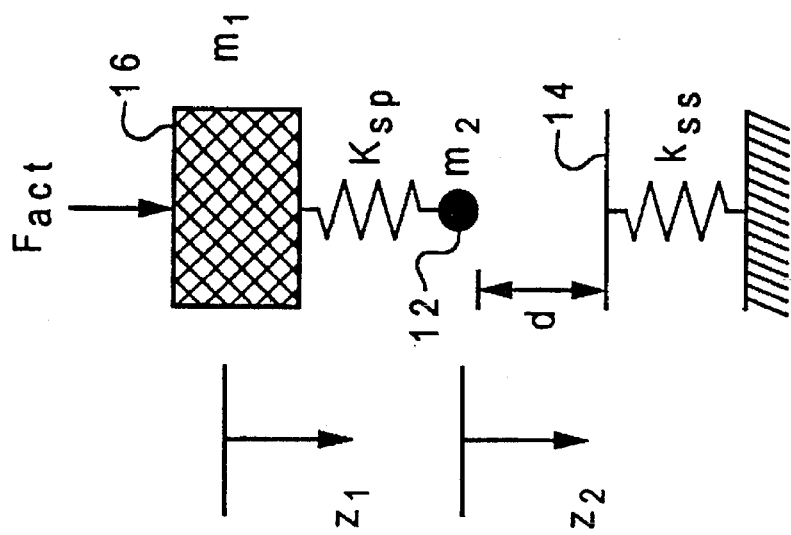
FIG. 2 is a schematic diagram of the probing system as described in FIG. 1.
Figure 1:
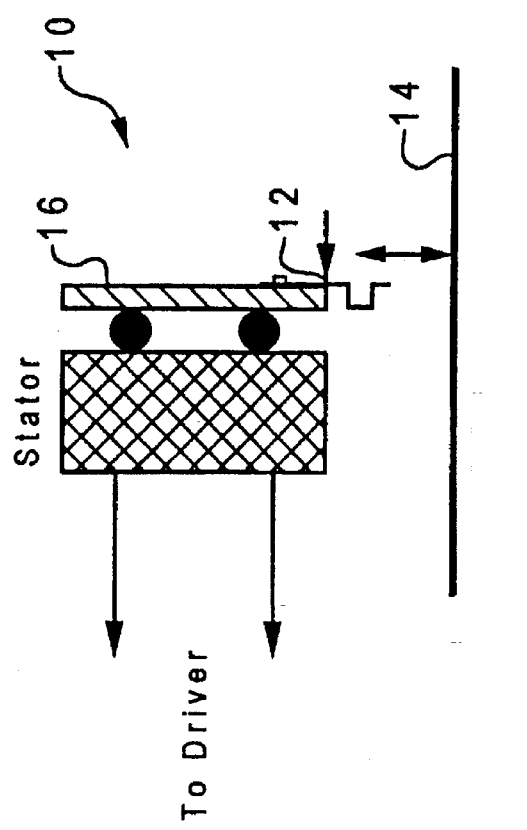
FIG. 1 depicts a typical probing system that consists of a probe actuator, a test probe, and a device under test according to the present invention.

With reference now to the figures, FIG. 1 shows a typical probing system that consists of a probe actuator 10, a test probe 12, and a device under test (DUT) 14. The schematic diagram of the probing system is illustrated in FIG. 2, where an armature 16 is modelled as a mass $m_1$ driven by the actuator force. The deflection of the probe and compressive characteristics of the device surface are represented by two springs with different spring constants $k_{sp}$ and $k_{ss}$ respectively. $M_2$ is the equivalent mass of test probe 12. d is the distance between probe tip and the surface of DUT 14. Note that d varies if the height of the surface changes or the DUT 14 is tilted. The dynamic response of the system can be described by the following equations:

$$m_1\ddot{z}_1 = F_{act} - k_{sp}(z_1 - z_2) \quad \text{Equation (1)}$$
$$m_2\ddot{z}_2 = -k_{sp}(z_2 - z_1) \quad \{z_2 < d\}$$
$$= -k_{sp}(z_2 - z_1) - k_{ss}(z_2 - d) \quad \{z_2 \geq d\}$$

where $z_2 \geq d$ indicates that probe contacts the device surface. The initial impact force of test probe 12 is proportional to the change of its momentum, $$F_{impact} \simeq m_2 \frac{(v_{2b} - v_{2a})}{\Delta t} \quad \text{Equation (2)}$$

where $v_{2b}$ and $v_{2a}$ are the velocities of $m_2$ before and after impact, respectively. Equation 2 suggests that a light probe mass with low impact velocity can reduce the impact force. The time period of the impact is $\Delta t$. The contact force applied by the test probe on the device surface is $$F_{probe} \simeq k_{sp}(z_1 - z_2) \quad \text{Equation (3)}$$

After the probe contacts the device surface ($z_2 \geq d$), the contact force varies according to the displacement $z_1$ of the armature and displacement $z_2$ of the probe tip. Which indicates a fast settling actuator armature improves the settling of contact force.

The settling of the armature is governed by the kinetic energy $m_1 v^2_{1b}$, spring constant $k_{sp}$ of the test probe, characteristics of the device surface $k_{ss}$, and damping $\zeta$ of the system, $v_{1b}$ is the armature velocity before impact. In practical applications, the $m_2$, $k_{sp}$ and $k_{ss}$ are determined by design specifications, but the impact velocity and damping ratio of the system are adjustable with an electronic controller.

Various control algorithms can be used for the probe actuator; however, the sudden change of system dynamics (refer to Equation 1) greatly affects the stability of the servo system. A proportional-plus-derivative (PD) position control is used to illustrate the change of servo stability. The dynamics of the actuator armature is simplified if the following assumptions are satisfied; they are 1. $m_1 > m_2$ and,
2. $k_{ss} > k_{sp}$ Typically, the equivalent probe mass is very small; $m_2$ can be fifty times smaller than $m_1$. Compared to the equivalent spring constant of the surface under test, the probe spring is also very small. Using the singular-perturbation techniques, the dynamics of the armature is simplified as a quasi-steady-state second-order system since the dynamic equations governing the probe mass $m_2$ can be neglected, i.e., $$0 \simeq m_2\ddot{z}_2 = -k_{sp}(z_2 - z_1) \quad \{z_2 < d\} \quad \text{Equation (4)}$$
$$0 \simeq m_2\ddot{z}_2 = -k_{sp}(z_2 - z_1) - k_{ss}(z_2 - d) \quad \{z_2 \geq d\}$$

Equation 4 results in $z_2 \simeq z_1$ for $z_2 < d$. After the test probe impacts the device surface, the maximum deviation $\Delta z_2$ of $m_2$ from distance d can be determined from the conservation of energy, $$\frac{1}{2} m_2 v_{2b}^2 = \frac{1}{2} k_{ss}\Delta z_2^2 \quad \text{Equation (5)}$$

where the impact between the probe tip and the device surface is assumed to be perfectly elastic. Now the $\Delta z_2$ can be computed as $$\Delta z_2 = \sqrt{\frac{m_2}{k_{ss}}} \, v_{2b} \quad \text{Equation (6)}$$

If both the ratio between $m_2$ and $k_{ss}$ and the impact velocity are small, $\Delta z_2$ is an extremely small number, and $z_2$ is approximate to $d (z_2 \simeq d)$ after the impact.

From the above observations, the transient response of the probe contact force is dominated by the transient response of the actuator armature only. The dynamic equations of the actuator armature can be approximated as $$(m_1 + m_2)\ddot{z}_1 = F_{act} \quad \{z < d\} \quad \text{Equation (7)}$$
$$m_1\ddot{z}_1 = F_{act} - k_{sp}(z_1 - d) \quad \{z \geq d\}$$

Assuming the force of the actuator is linearly proportional to the current flowing through its coils, the actuator force is $$F_{act} = k_f i_{act} \quad \text{Equation (8)}$$

where $k_f$ is the force constant of the actuator; its unit is newton/ampere. If a proportional-plus-derivative controller is used, the actuator force is regulated as $$F_{act} = k_f[k_p(z_{1c} - z_1) - k_v \dot{z}_1] \quad \text{Equation (9)}$$

where $k_p$ is the proportional gain, and $k_v$ is the derivative gain, $z_{1c}$ is the commanded position of the armature. The natural undamped frequency $w_n$ and the damping ration $\zeta$ of the system are $$w_n = \sqrt{\frac{k_p k_f}{m_1 + m_2}}$$
$$\zeta = \sqrt{\frac{k_v^2 k_f}{4k_p(m_1 + m_2)}} \quad \{z_2 < d\} \quad \text{Equation (10)}$$

and $$\quad \text{Equation (11)}$$

The damping ratio is reduced after impact. The reduction of the damping ratio introduces oscillatory response in the armature and undesirable transient probe $$w_n = \sqrt{\frac{k_p k_f + k_{sp}}{m_1}}$$
$$\zeta = \sqrt{\frac{k_v^2 k_f^2}{4(k_p k_f + k_{sp})m_1}} \quad \{z_2 \geq d\}$$

contract force. The peak transient contact force caused by the maximum overshoot of the armature can damage the device under test; the maximum overshoot increases with a decrease in the damping ratio $\zeta$. The steady-state probe force of the PD controller is $$F^s_{probe} \simeq \frac{k_{sp} k_p k_f(z_{1c} - d)}{k_{sp} + k_p k_f} \quad \text{Equation (12)}$$

In equation 12, the steady-state probe force is sensitive to the $z_{1c} - d$, spring constant $k_{sp}$, and proportional gain $k_p$. Up to this point, it has been demonstrated that a simple PD controller cannot satisfy the requirements for high-speed probing.

Now described is a novel two-mode control method that can be easily implemented with a digital or an analog controller, for a high-speed probe actuator used in testing applications. A flowchart of the method and an analog controller design are disclosed. This method reduces the impact force and improves the settling of the actuator armature. In the first-mode position control, the actuator is servoed toward the device surface ($z_{1c}<d$), so the probe tip is close to but not touching the device surface; this step reduces the impact velocity, which affects both the impact force and the actuator settling. Once the velocity approaches zero, the second-mode open-loop force control starts. If the position servo system is overdamped or slightly underdamped, a small position error ($z_{1c}-z_1$) indirectly indicates the actuator velocity is low. Hence, the position error is used to switch the system from the position-control mode to the force-control mode. The force control is accomplished by setting $k_p$ to zero and regulating the actuator current as $$i(t) = I_f - k_v \dot{z}_1 \qquad \text{Equation (13)}$$

where $I_f$ is a constant which is determined by the steady-state probe force and is computed such that $$F_{probe}^s = k_f I_f \qquad \text{Equation (14)}$$

Comparing Equation 14 to Equation 12, the probe force is now independent of the test probe, servo system, and distance d. If the actuator force is calibrated, the probe force can be very consistent. Moreover, the probe contact force can easily be adjusted by changing the $I_f$.

In Equation 13, the derivative gain $k_v$ provides the viscous damping to the system and enables the armature to settle out fast. Without this viscous damping, ideally, the armature will oscillate forever after impact. Practically, the armature will settle out in a long period of time because of the inherent friction force in the system. In order to achieve fast settling of the actuator armature, sufficient viscous damping is required. In the force-control mode, the dynamics of the actuator armature can be characterized as $$m_1 \ddot{z}_1 = k_f(I_f - k_1 \dot{z}_1) - k_{sp}(z_1 - d) \qquad \text{Equation (15)}$$

$$w_n = \sqrt{\frac{k_{sp}}{m_1}}$$

$$\zeta = \sqrt{\frac{k_v^2 k_f^2}{4 k_{sp} m_1}}$$

In Equation 15, the damping ratio of the servo system is increased by setting $k_p=0$. It should be noted that, theoretically, the $k_p$ can be set to a negative value to increase the damping ration further. The increase of the damping ration reduces not only the maximum overshoot of the armature, but also the peak transient probe force. Mathematically, the viscous damping can be increased by augmenting the derivative gain $k_v$; however, in reality, the value of $k_v$ cannot exceed an upper bound because of the noise of the velocity transducer, otherwise the servo system begins to oscillate or to ring. The increase of damping ration by setting $k_p=0$ is advantageous to the hardware implementation. Note that an analog viscous damping signal provided by a tachometer or an electronic differentiator is more effective than the damping signal generated by a digital controller because the analog signal continuously dampens the system, while the damping signal of the digital controller is limited by the discrete sampling period. Both analog and digital damping are used in practice; the former provides a fixed continuous damping, and the latter is adjusted to compensate the small parameter variations in the actuator system.

Figure 3:
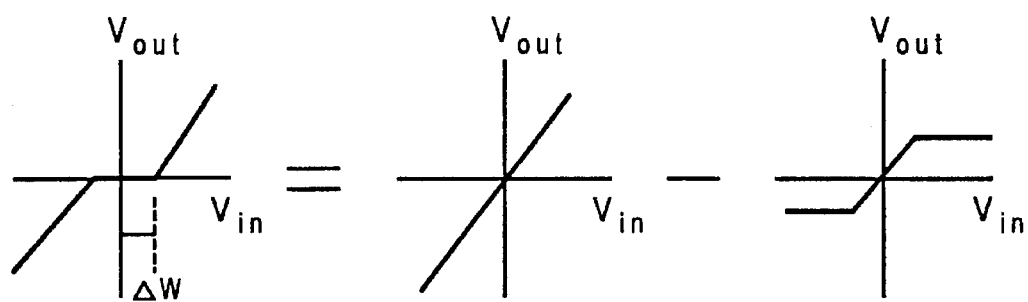
FIG. 3 depicts a prior art implementation of a linear amplifier with a dead zone of 2ΔW

One remaining problem with the open-loop force control is that the armature can run into the device surface in case of a break in the probe or an erroneous trigger of the open-loop force control. A better alternative is to introduce a dead-zone nonlinearity in $k_p$, as shown in FIG. 3, so the $k_p$ is zero when $z_{1c}-z_1$ falls in the range of $\pm \Delta w$, which is determined by $$\Delta w > \frac{F_{probe}^s}{k_{sp}} + \Delta d_{max} \qquad \text{Equation (16)}$$

where $\Delta d_{max}$ is the maximum allowed deviation from the nominal distance d between the probe tip and device surface when the armature is in the retracted position. The actuator current in the force-control mode is modified as $$i(t) = I_f + k_p'(z_{1c}-z_1) - k_v \dot{z}_1 \qquad \text{Equation (17)}$$

where $k_p'$ is the nonlinear proportional gain. When the armature moves beyond the allowable window $\Delta w$, the gain $k_p'$ will pull the armature back and prevent it from running into the device surface.

Figure 4:
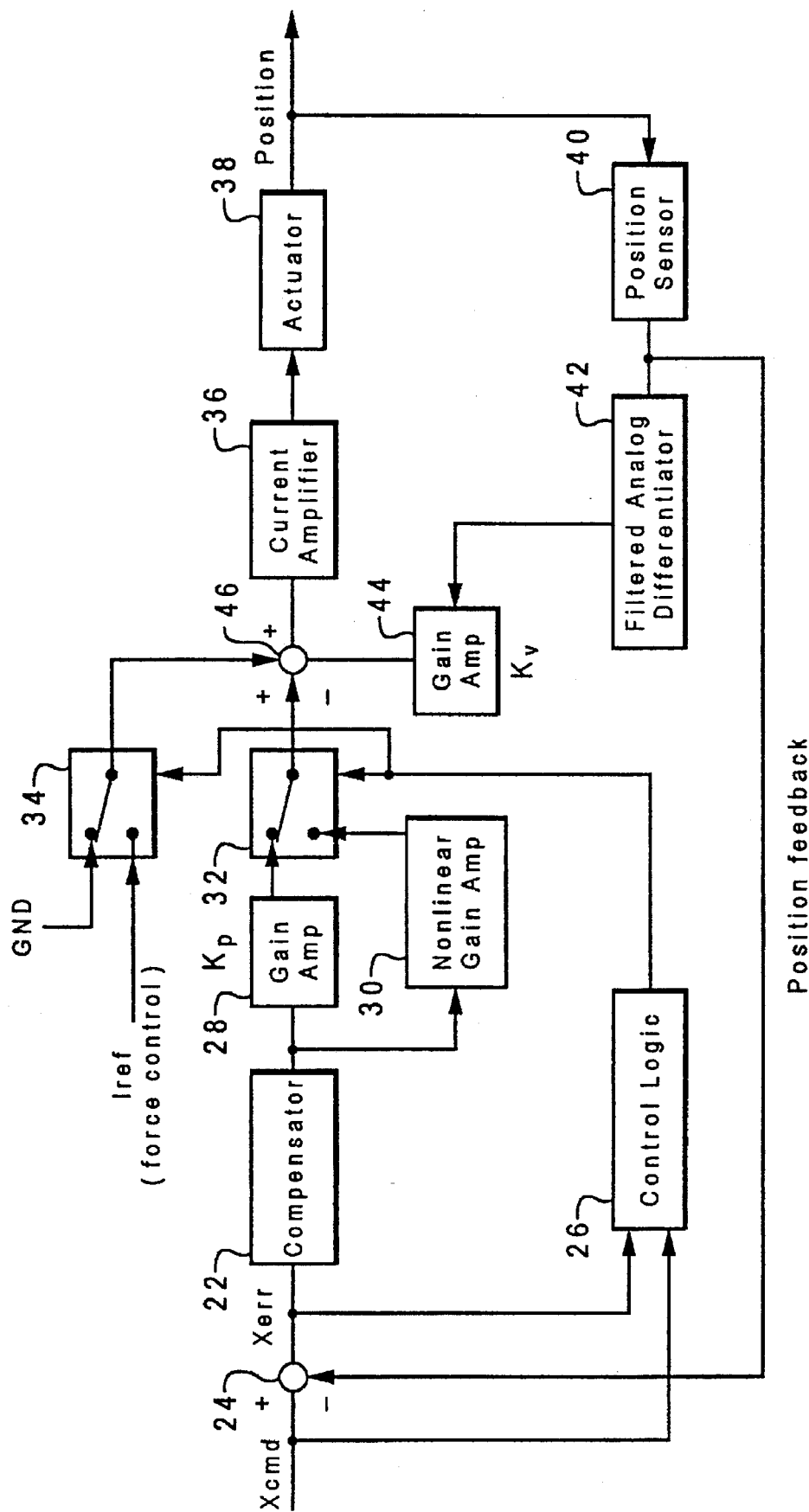
FIG. 4 is a block diagram of a two-mode digital controller according to the present invention.
Figure 5:
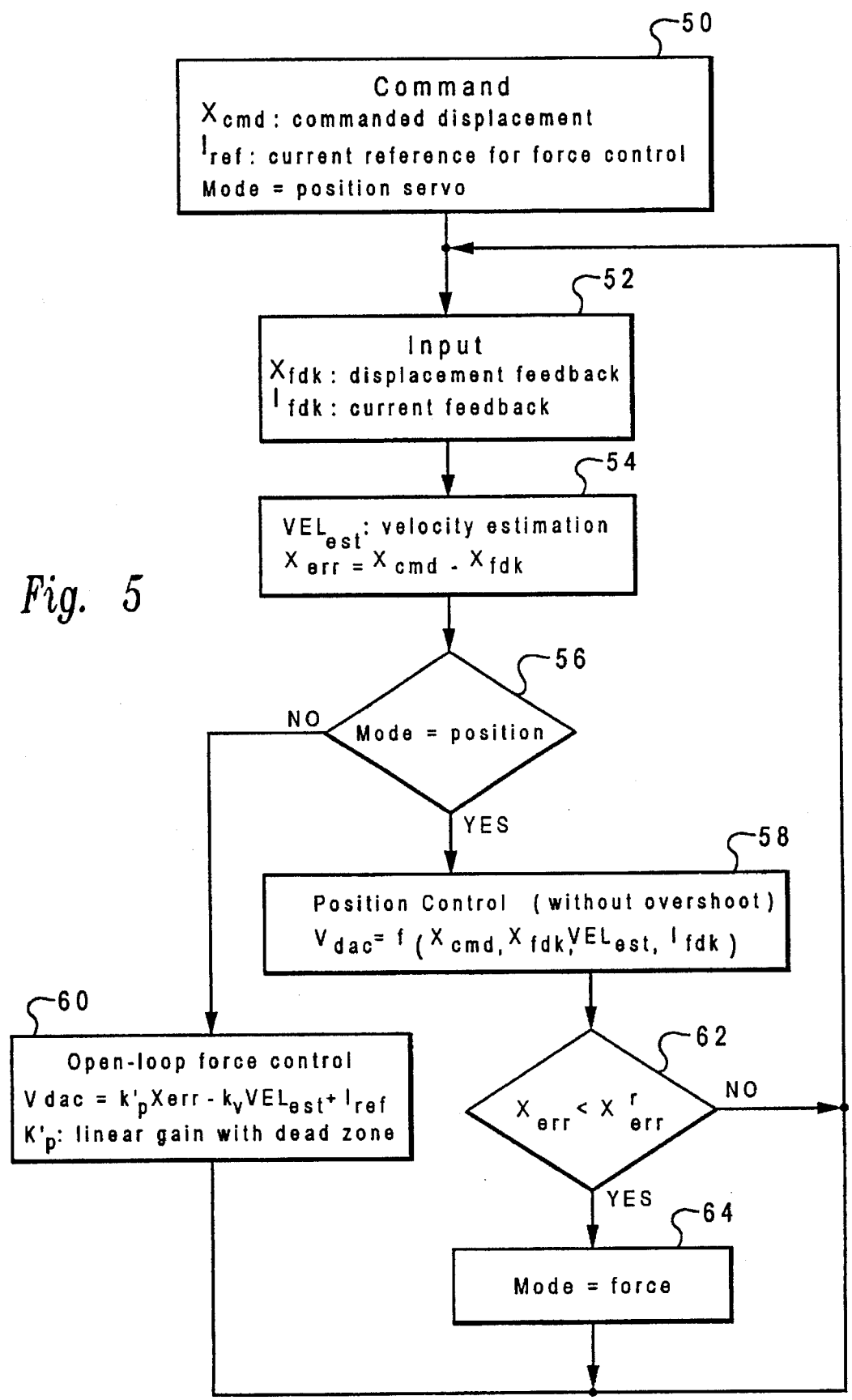
FIG. 5 depicts a flowchart of the operation of the controller as depicted in FIG. 4.
Figure 6A:
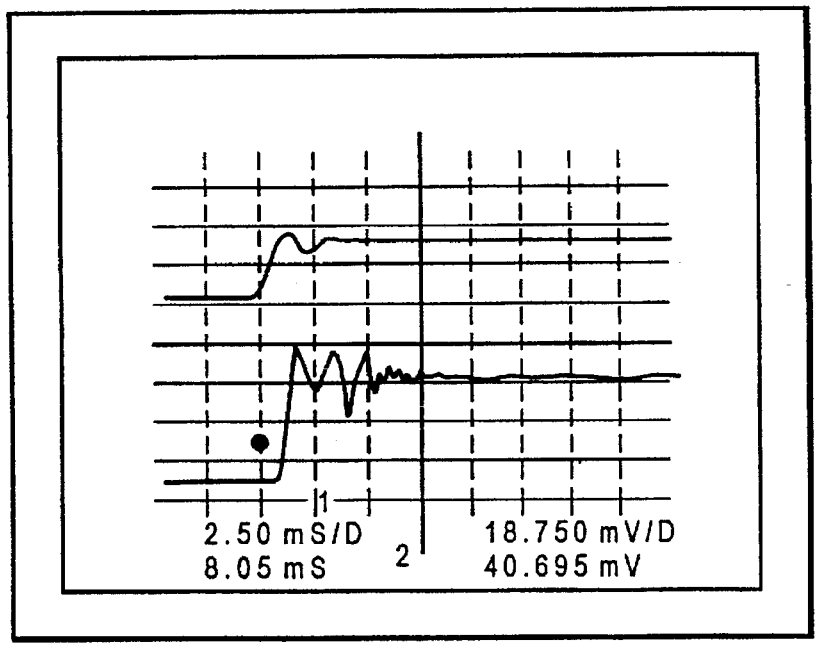
FIG. 6a illustrates displacement of the armature and the probe force in different distance d with a large impact force and long probe settling time where a conventional PD control is used.
Figure 6B:
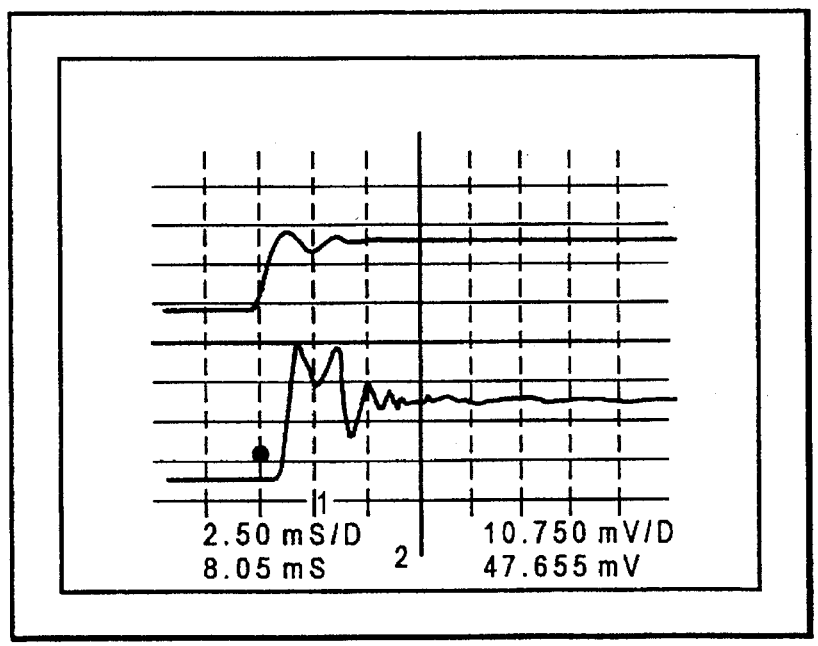
FIG. 6b also illustrates displacement of the armature and the probe force in different distance d with a large impact force and long probe settling time where a conventional PD controller is used.
Figure 6C:
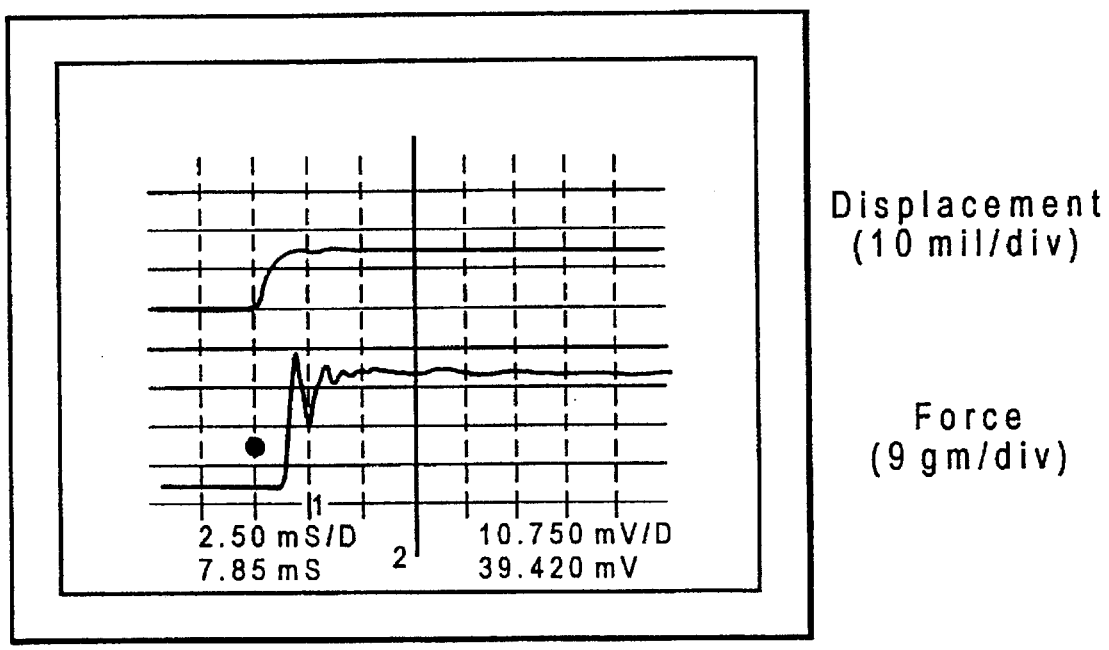
FIG. 6c depicts the performance of the two-mode controller where the impact force and probe settling time are reduced significantly.
Figure 6D:
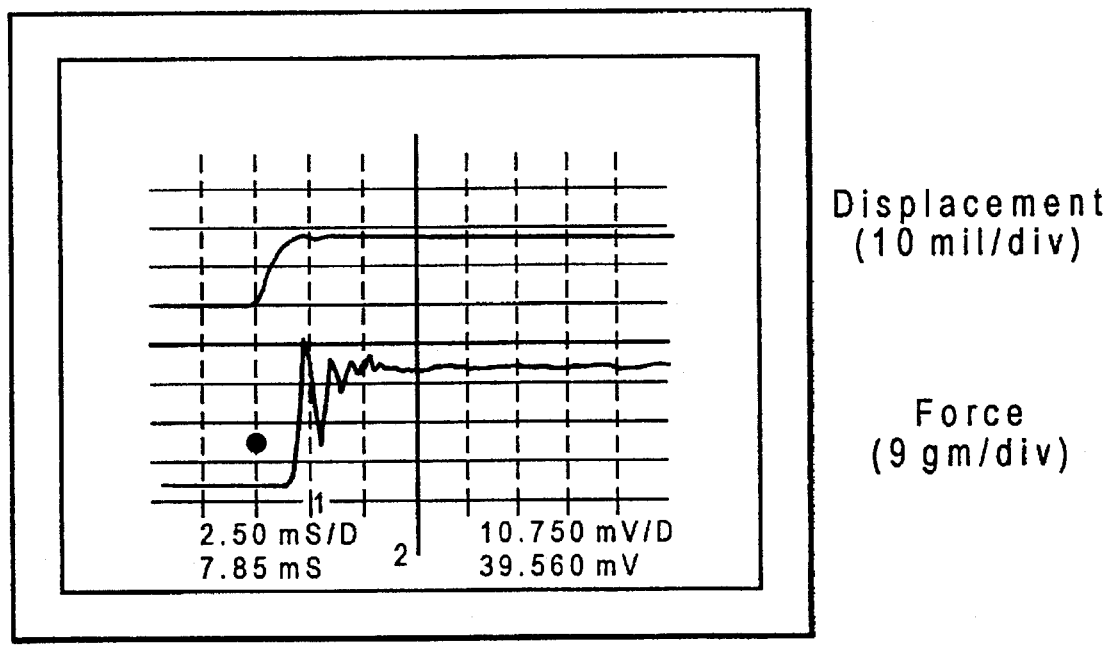
FIG. 6d also depicts the performance of the two-mode controller where the impact force and probe settling time are reduced significantly.

The block diagram of a two-mode digital controller is shown in FIG. 4. A flowchart of the operation of the controller is depicted in FIG. 5. FIG. 6 illustrates displacement of the armature and the probe force in different distance d with the PD or two-mode control method. A large impact force and long probe settling time are observed in FIG. 6A, where a conventional PD control is used. A noticeable decrease in the steady-state contact force is shown in FIG. 6B because the distance d is 14 mils while $z_{1c}$ is 12 mils. FIG. 6C and FIG. 6D illustrate the performance of the two-mode controller. The impact force and probe settling time are reduced significantly. Also, the steady-state probe contact force is insensitive to the variation in distance d.

A two-mode controller 20 is shown in the block diagram of FIG. 4. Summing point 24 receives input command $X_{cmd}$ and position feedback Xfdk from position sensor 40 to generate position error $X_{err}$. Driven by $X_{err}$, compensator 22 is used to stabilize the servo loop so there is no overshoot in position-control mode. The output signal from compensator 22 feeds to both linear gain amplifier 28 and nonlinear gain amplifier 30. Gain amplifier 28 sets the proportional gain $K_p$ for the proportional-plus-derivative (PD) control, and the nonlinear amplifier 28 provides a linear amplification with a dead zone 2$\Delta$W described in Equation 16.

Based on position command $X_{cmd}$ and position error $X_{err}$, control logic 26 determines the control mode of the servo system. Control logic 26 directs switch 32 to use linear gain amplifier 28 and switch 34 to select the zero volt in position servo mode. Otherwise, in force-control mode, switch 32 selects nonlinear amplifier output, and switch 34 chooses voltage $I_{ref}$ as the current command.

Driven by current amplifier 36, actuator 38 moves a test probe, and its position is sensed by position sensor 40. The output of sensor 40 is fed back to node 24 and sent to a filtered analog differentiator 42 to generate a velocity signal. Gain amplifier 44 provides the derivative gain $K_v$ of the PD loop. Summing node 46 receives signals from switch 32, switch 34, and gain amplifier 44 and sends its output to current amplifier 36 to drive the actuator 38.

The function of summing point 24, compensator 22, gain amplifier 28, nonlinear gain amplifier 30, control logic 26, switch 32, and switch 34 can be carried out by using a digital processor and a digital-to-analog convertor; its output ($V_{dac}$) minus the feedback from gain amplifier 44 is used to drive current amplifier 36. The flow chart of the digital processor is illustrated in FIG. 5.

In step 50, the processor issues a command $X_{cmd}$ to move the probe to a given position and a command $I_{ref}$ for force control. It also sets the actuator system to the first mode for position control. Next, in step 52, the processor senses the displacement feedback $X_{fdk}$ end current feedback $I_{fdk}$ of the actuator 38. Based on the feedback signals, the processor, in step 54, computes the estimated velocity VELest and position error $X_{err}$ of the actuator 38. In step 56, the processor determines that either a position control function in step 58 or a force control function in step 60 should be used. In step 58, the $V_{dac}$ is generated by a control function that uses all or a subset of $4X_{cmd}$, $X_{fdk}$, VELest, and $I_{fdk}$ as its arguments. Many control functions or algorithms can be used for the position-control loop, such as those described in "Digital Control System" by Benjamin C. Kuo. Following step 58, the processor finds whether the actuator is close to the target position by comparing the position error $X_{err}$ to a reference value $X_{err}$ in step 62 and, if $X_{err}$ is greater than $X_{err}$ the flow returns to step 52 without changing the servo mode. Once the position error $X_{err}$, is less than the reference value $X_{err}$, the servo mode is set to force-control mode in step 64, and then flow returns to step 52. Now, the control function in step 60 is used for the force control until a new command is issued.

In step 60, the $V_{dac}$ is generated by a proportional-plus-derivative control algorithm with a nonlinear proportional gain illustrated in FIG. 3 and a reference value $I_{ref}$ for the force control.

Figure 7:
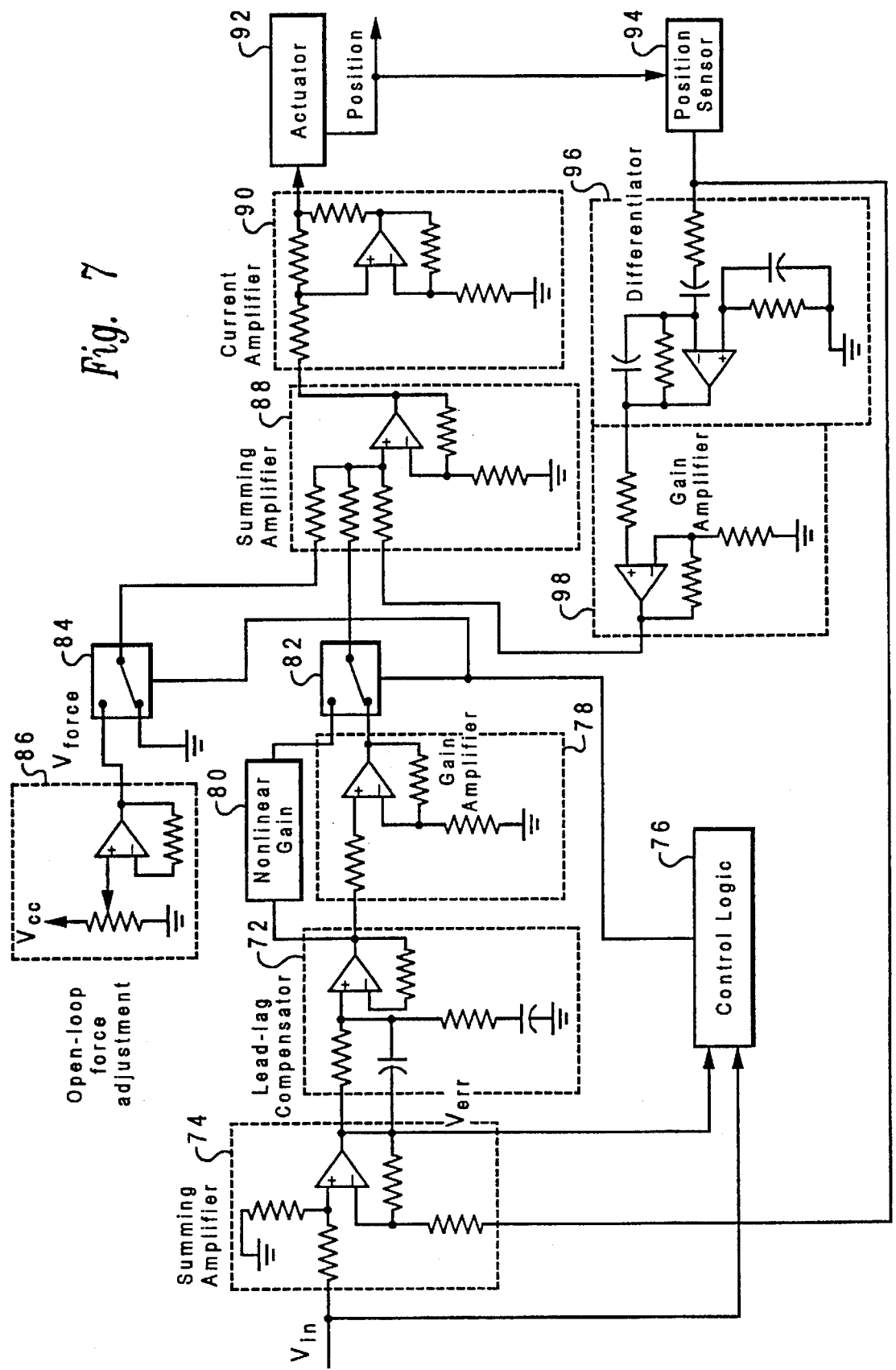
FIG. 7 depicts an analog controller as represented in the block diagram of FIG. 4.

An analog controller illustrated in FIG. 7 is also designed for low-cost applications. It is an analog implementation (except the control logic) of the block diagram shown in FIG. 4. $V_{in}$ is the reference voltage for the position command $X_{cmd}$, and $V_{err}$ is the voltage value of the position error $X_{err}$. Summing amplifier 74 generates position error $V_{err}$, which the command $V_{in}$ minus the feedback from position sensor 94. A lead-lag compensator 72 is used so there is no overshoot in the position servo loop. Its output feeds the linear gain amplifier 78 and nonlinear gain amplifier 80.

The output $V_{err}$ of the summing amplifier 74 and the position command $V_{in}$ are used in control logic 76 directs switch 82 to use linear gain amplifier 78 and switch 84 to select the zero volt in position-control mode. Otherwise, in force-control mode, switch 82 selects nonlinear amplifier output and switch 84 chooses the reference $V_{force}$ as the current command.

Summing amplifier 88 sums up the outputs from switch 82, switch 84, and velocity gain amplifier 98 to generate a command signal to feed the current amplifier 90 which drives the actuator 92. Differentiator 96 derives the actuator velocity from the output of the position sensor 94 and then sends the signal to gain amplifier 98.

Figure 8:
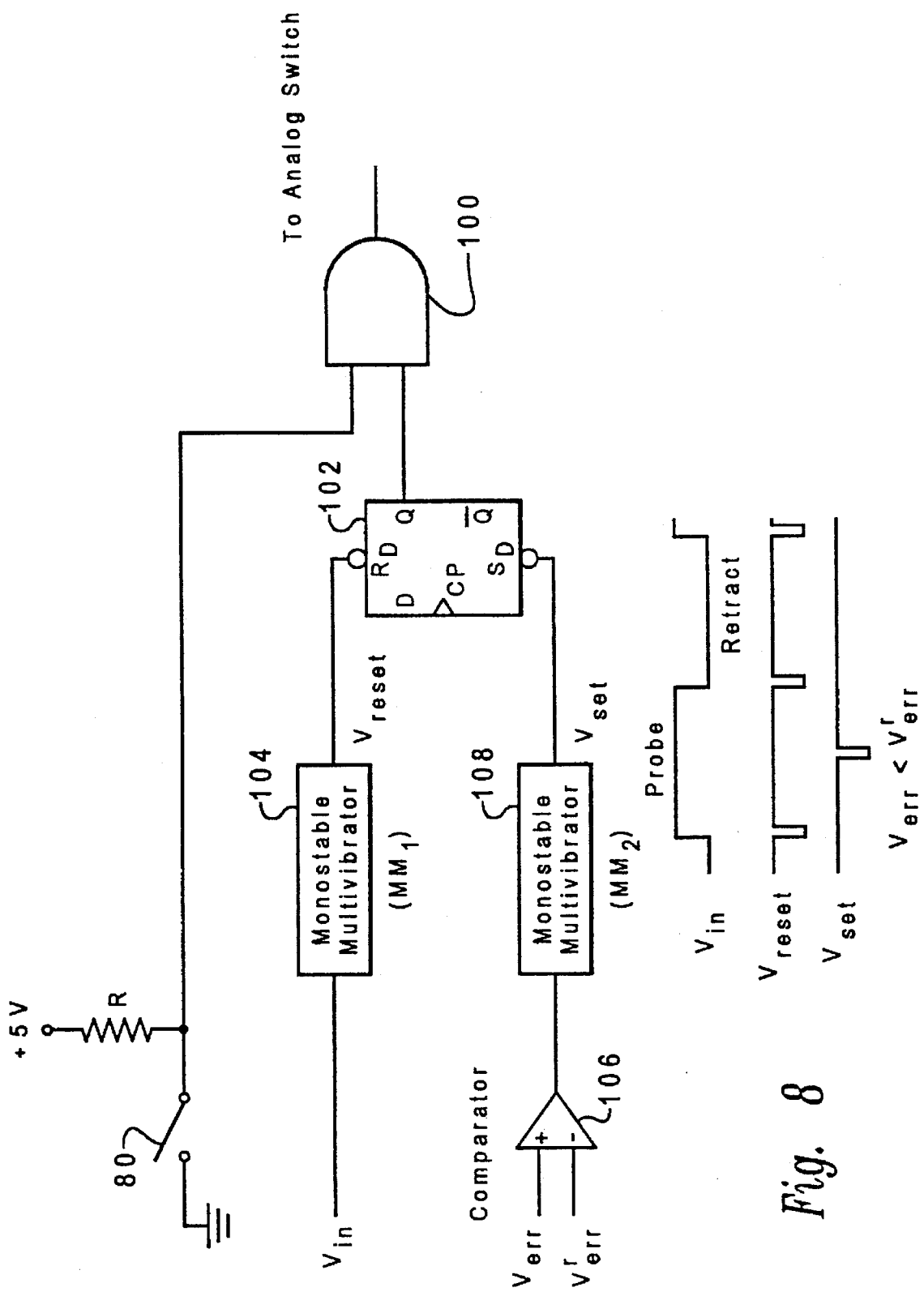
FIG. 8 illustrates a logic circuit according to the present invention.

The switch between the position and force control is decided by the control logic 100 illustrated in FIG. 8. The actuator system is always in position-control mode unless switch SO is open. When there is a change in the command $V_{in}$, D flip-flop 102 is reset by the output of the multivibrator MM1 104. This resets the system to position-control mode. Force-control mode starts when compensator 106 decides whether the error $V_{err}$ is smaller than a preset value $V_{err}$; a small position error shows that the actuator is close to the commanded position. Once $V_{err}$ is less than $V_{err}$, the multivibrator MM2 108 sets D flip-flop 102 and, therefore, enables force-control mode. Note that position-control mode is used when the actuator retracts toward its start position.

Figure 9:
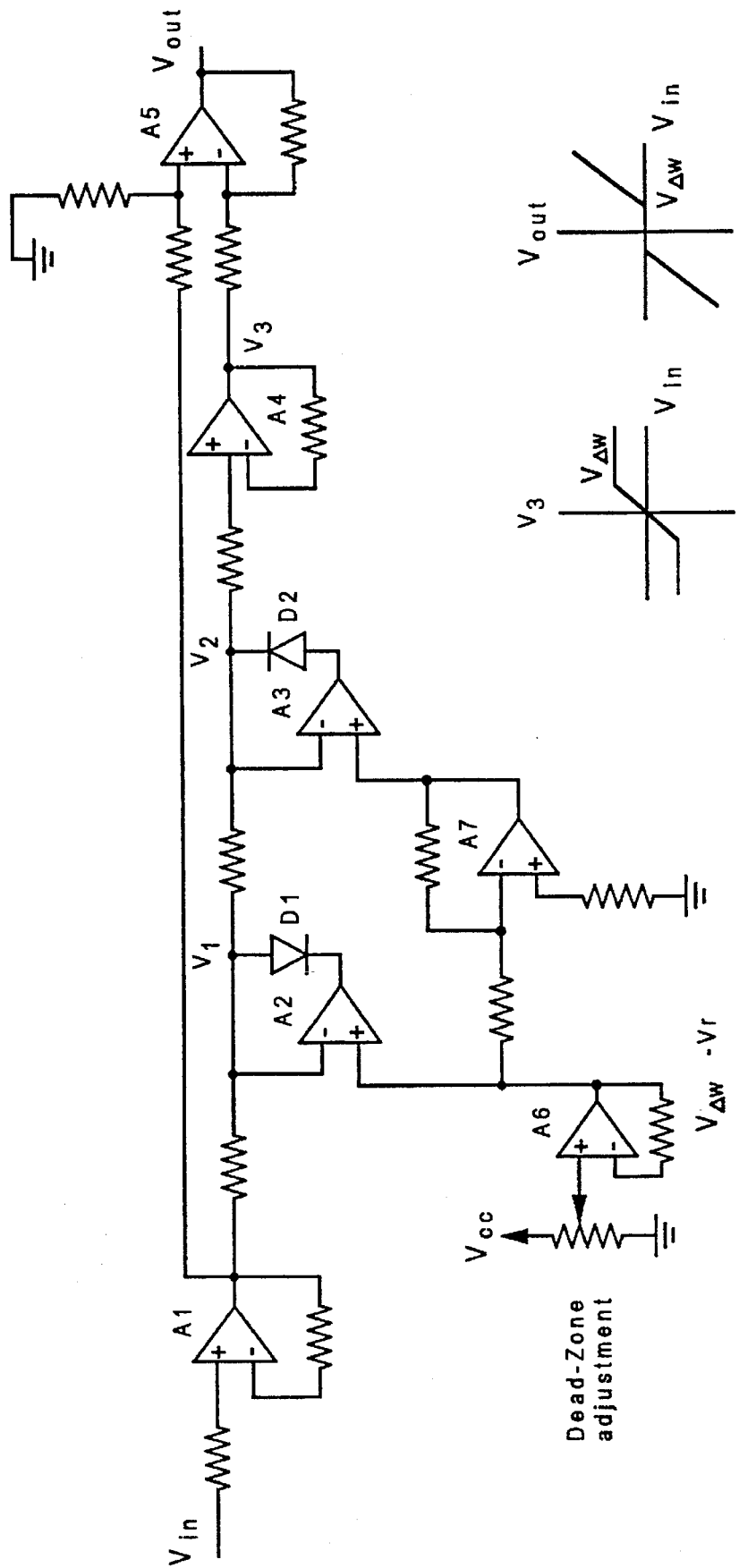
FIG. 9 is a nonlinear analog amplifier with a dead zone as described in the present invention.

A circuit design of the nonlinear gain amplifier is shown in FIG. 9. Amplifier A1 is used as a buffer so that its output is the same as the input command $V_{in}$. Amplifier A6 is also a buffer and its output is set to $V_{AW}-V_r$, where $V_r$ is the threshold voltage for diode D1 and diode D2 to turn on. Amplifier A2 and diode D1 are used to clamp the voltage V1 to $V_{AW}$. The output of the amplifier A6 is inverted by amplifier A7 so that amplifier A3 and diode D2 can clamp voltage V2 to $-V_{AW}$, and then the voltage V2 is buffered by amplifier A4. The voltage V3 follows the command $V_{in}$ until it reaches the saturation levels $\pm V_{AW}$. Amplifier A5 is used to subtract voltage V3 from input command $V_{in}$ and, hence, generates the dead zone $V_{AW}$.

Figure 10:
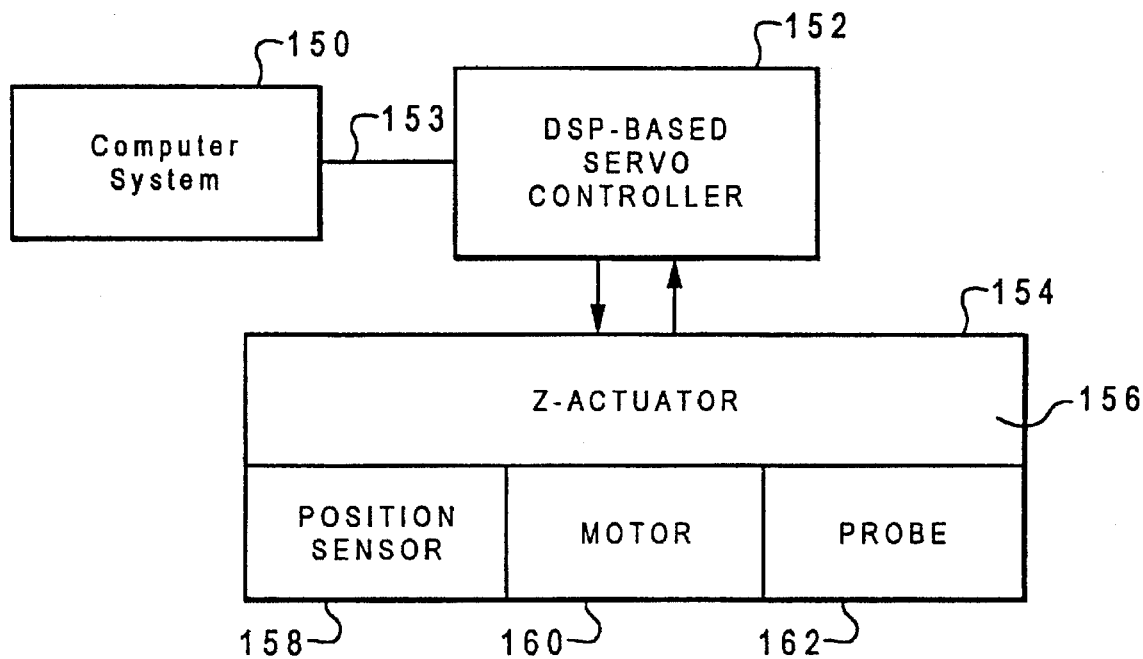
FIG. 10 is a block diagram depicting a system for implementing another method for positioning probes automatically and with a high rate of speed by measuring the distance between the probe and the DUT surface for contact according to the present invention.

An alternative method and system for positioning probes automatically and with a high rate of speed is to measure the distance between the probe and the DUT surfaces for contact. A system for implementing such a probe actuator is shown in the block diagram of FIG. 10 and the schematic diagram of FIG. 11. In FIG. 10, a computer system 150 is preprogrammed with the sequence of operations for controlling a DSP-based servo controller 152 connected via fiberoptic link 153. Controller 152 uses a digital signal processor (DSP) and further including control devices, such as, for example, digital to analog and analog to digital converters. Additional communication hardware for connecting to computer system 150 is also provided. The control commands are used to control the motor position, check the motor status and operation, drive the amplifier and power supply for the motor drive, and read the position sensor, indicating the position of the probe relative to the DUT. Controller 152 connects to actuator 154 via a bi-directional line and further includes a Z directional actuator 156, a position sensor 158, a motor 160, and a probe 162. Actuator 154 uses a voice coiled drive motor 160 to drive a carbon composite armature.

Figure 11:
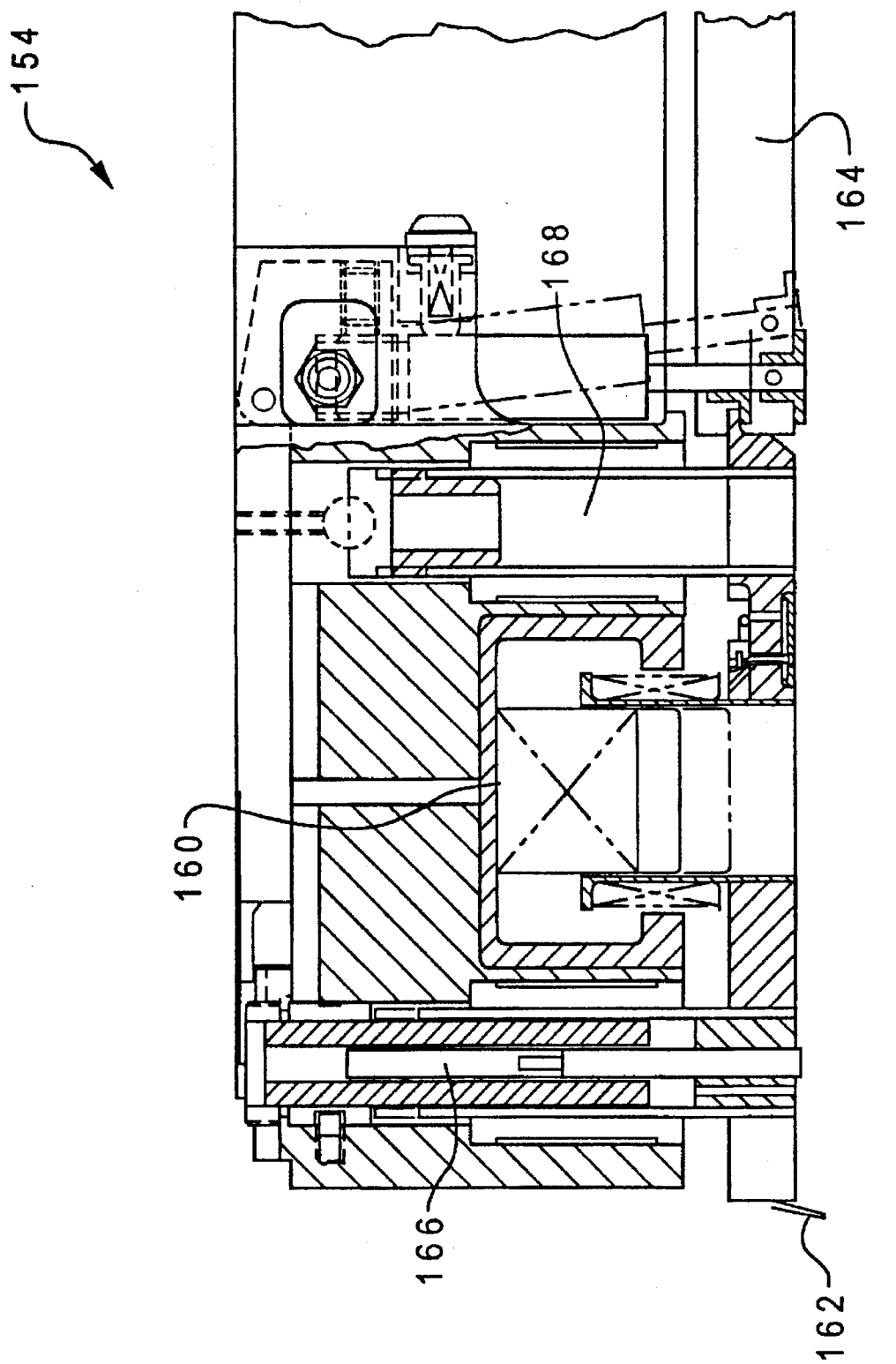
FIG. 11 is a schematic view of a system as described in FIG. 10.

Actuator 154 is also shown in FIG. 11, and further includes a carbon composite armature 164 constrained by two air bearings 166 and 168. A linear voltage differential transformer (LVDT) 170 provides position feedback at an approximate resolution of 1 micron.

The system and method operate in two modes, the first mode being a closed-loop mode and the second mode being an open-loop mode. The program being stored in RAM further includes diagnostic programs, which are used in place of the servo program during system maintenance and set-up. Specifically, the diagnostic programs are developed for characterization, tuning, and testing of the probe actuators.

The system first operates in a closed-loop servo control mode during actuation. The system then prepares a motion profile for maximizing the velocity to the approach point on the DUT. Next, the system enters the open-loop mode for controlling the force of the probe during contact with the DUT. The system then proceeds to contact the DUT at a reduced speed to obtain the height measurements at the X-Y location while minimizing damage to the DUT surface. This height measurement is then later used to approach the test site with the probe at a high speed. Finally, the system automatically switches to the open-loop force control mode in response to the need to slow the speed below that which would lead to a certain amount of damage to the DUT.

When the actuator controller is in open-loop force control, the actuator controller applies a constant voltage to actuator motor 160. The voltage level is conveyed as part of the open-loop commands. The maximum voltage level is set in a configuration file and represents a voltage level such that the resulting probe force is non-damaging to the DUT. The open-loop voltage is varied during the execution of the probing control program and can be selected from system configuration panels. The voltage can also be self based on DUT requirements.

Figure 12:
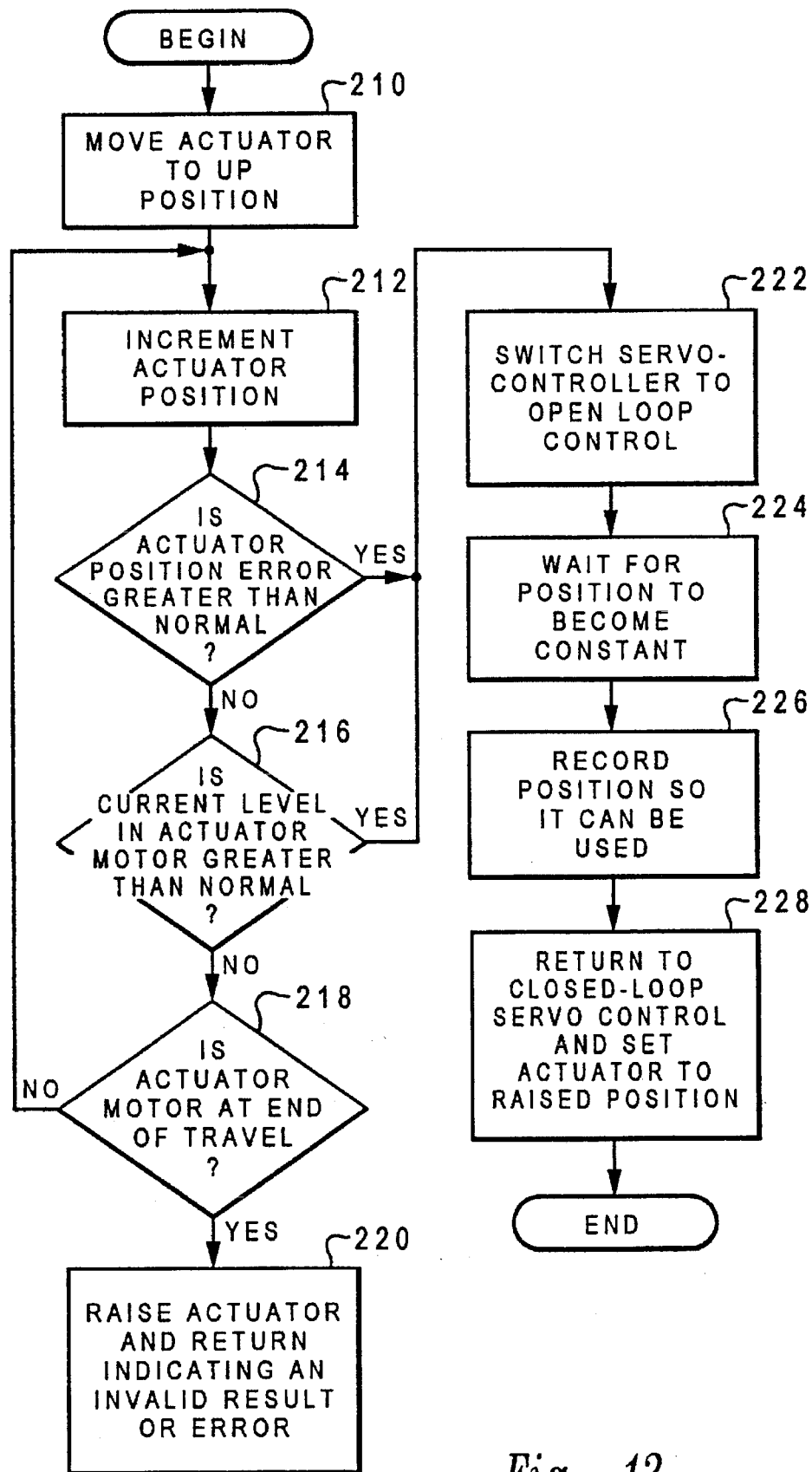
FIG. 12 is a flow chart illustrating the method of determining the position of an object or DUT under a probe in a probing machine as described in the present invention.

A method of determining the position of an object or DUT under a probe in a probing machine is depicted in the flowchart of FIG. 12. The results of the probe position are then used in the probing method illustrated in the flow chart of FIG. 13. In step 210, the system moves the actuator to an "up" position. In step 212, the system increments the actuator position. In step 214, the system checks whether the actuator position error is greater than an expected or normal value with the resolution being about one micron. If the error level is acceptable, the system, in step 216, determines whether the current level in the actuator motor is greater than a set or normal value. In either step 214 or step 216, if the error is above normal or the current level is above normal, the system returns to increment the actuator position in advances to step 222. If both the actuator position and the current level are normal, the system determines whether the actuator motor has reached the end of travel in step 218 and, in step 220, raises the actuator and returns an indication signal that an invalid result has occurred. Otherwise, in 218, if the actuator motor is not at the end of travel, the system returns to step 212.

In step 222, the system switches the servo controller to an open-loop control. Next, in step 224, the system waits for the position above the DUT to become constant. In step 226, the system records the position for later use in the probe locating routine of FIG. 13. Finally, in step 228, the system returns to the closed-loop servo control and sets the actuator to the raised or up position.

Figure 13:
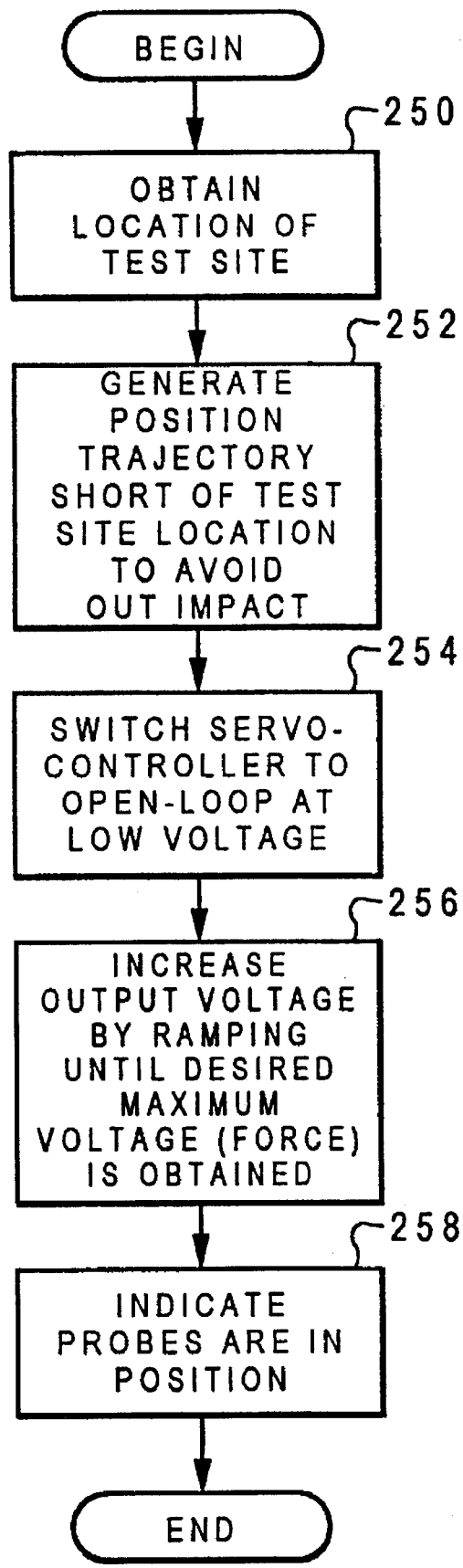
FIG. 13 depicts a flowchart illustrating the results of the probe position as described in the probing method of FIG. 12.

After obtaining the position and returning the actuator to the up position, the system, according to the flowchart in FIG. 13, positions the probe in a high-performance low-damage arrangement on the test site. In step 250, the system obtains the location of the test site or DUT. The position of the DUT relative to the actuator is obtained non-destructively using the method in FIG. 12. A surface map is obtained as needed and interpolation is used between various data points calculated in the method of FIG. 12. Then, in step 252, the system determines or generates a position trajectory short of the test site location so as not to impact the DUT. Normally, a constant velocity profile is used as input to the position controller to minimize overshoot. The system provides for positioning the probe just short of the test site without impacting the test site. In step 254, the system switches the servo controller to open-loop at a low voltage. This allows the controller to minimize any abrupt changes and forces that lead to product damage. The voltage applied is such that a low force drives the actuator, or probe, into contact with the DUT. In step 256, the system increases the output voltage by ramping until a desired maximum voltage (force) is obtained, based upon the motor being used. The voltage is increased at a constant rate until the desired probe force is obtained, this minimizes force transients that otherwise cause damage. Finally, in step 258, the system indicates that the probes are in position. Due to observed stability in the position feedback, the system signals the main controller that the probes are in contact and a measurement is then taken. The position of the probe is saved at this point so that the value can be used. This is desirable when the height of the product is desired or when the value would be appreciably more accurate than the interpolated/extrapolated value.

Thus it has been shown that a non-destructive means for determining the position of an object under a probe in a probe machine may be achieved. By obtaining the height position of the DUT in a non-destructive manner and using the height position information during testing, the system can increase the speed and reduce the damage during the testing procedure. Controlling the contact force provides for sufficient contact pressure, which results in a reliable measurement, while minimizing damage.

For determining the position for flat or coplanar devices, three points are obtained using the positioning method of FIG. 12 first and FIG. 13 second to define the position at which the actuator encounters the device when positioned. For irregular surfaces, a surface map is derived from measurements at regular spacings across the device surface and supplied to the probe controller prior to actuation for any XY location. The controller then uses a linear extrapolation method and expected deviation to predict where the surface would be at that particular point. Additionally, the positioning method of FIG. 13 provides gross positioning of the probe, provided that some damage to the DUT is acceptable.

In this disclosure a digital and analog controller of a novel method for the control of a high-speed probe actuator are presented. This invention provides the probe actuator system with improved damping ratio and reduced impact force, so the throughput of the tester is increased with fast settling actuator armature. With this invention, the steady-state probe force is less sensitive to the servo system, test probe and variation in the probing distance d. This invention is readily implemented and eliminates the need for a force transducer. A novel electronic circuit, which consists of analog operational amplifiers, monostable multivibrators, and D flip-flops, is presented for low-cost applications.

While the invention has been particularly shown and described with reference to a preferred embodiment, it will be understood by those skilled in the art that various changes in form and detail may be made therein without departing from the spirit and scope of the invention.

We claim:

1. A two-mode controller for a high-speed probe actuator used in testing electronic devices, comprising:

means for positioning a test probe connected to said probe actuator to a first position short of actual contract to a device under test (DUT) solely in response to detection of a position of said test probe; and means for controlling the force of said probe actuator in placing said test probe on said DUT only after said positioning means completes its placement of said test probe at said first position.

2. The invention according to claim 1 wherein said positioning means further comprises:

a position sensor, coupled to said probe actuator, for detecting the position of said test probe in relation to said first position;

a position compensator, coupled to said position sensor, for controlling the position of said test probe in relation to the position sensed by said position sensor.

3. The invention according to claim 2 further comprising means for determining an estimated velocity of said probe actuator for determining the velocity of said probe actuator for use in determining whether said positioning means should be switched to said force means for positioning said probe actuator with respect to said device under test.

4. The invention according to claim 1 further comprising dampening means for generating a viscous dampening signal coupled to said positioning means and said force control means for dampening oscillations in said probe actuator during positioning.

5. The invention according to claim 4 wherein said dampening means generates an analog viscous dampening signal.

6. The invention according claim 5 wherein said dampening means generates a digital dampening signal.

* * * * *